(12) United States Patent
Lutz et al.

(10) Patent No.: US 10,310,809 B2
(45) Date of Patent: Jun. 4, 2019

(54) APPARATUS AND METHOD FOR SUPPORTING A CONVERSION INSTRUCTION

(71) Applicant: ARM LIMITED, Cambridge (GB)

(72) Inventors: David Raymond Lutz, Austin, TX (US); Neil Burgess, Cardiff (GB); Kelvin Domnic Goveas, Austin, TX (US)

(73) Assignee: ARM Limited, Cambridge (GB)

( * ) Notice: Subject to any disclaimer, the term of this patent is extended or adjusted under 35 U.S.C. 154(b) by 47 days.

(21) Appl. No.: 15/093,947

(22) Filed: Apr. 8, 2016

(65) Prior Publication Data

US 2017/0293467 A1    Oct. 12, 2017

(51) Int. Cl.
| | |
|---|---|
| *G06F 5/01* | (2006.01) |
| *G06F 9/30* | (2018.01) |
| *H03M 7/24* | (2006.01) |
| *G06F 7/483* | (2006.01) |

(52) U.S. Cl.
CPC .............. *G06F 5/015* (2013.01); *G06F 7/483* (2013.01); *G06F 9/30014* (2013.01); *G06F 9/30025* (2013.01); *H03M 7/24* (2013.01)

(58) Field of Classification Search
CPC ...................................................... H03M 7/24
See application file for complete search history.

(56) References Cited

U.S. PATENT DOCUMENTS

| 5,262,971 A | 11/1993 | Yamaguchi |
| 5,561,615 A | 10/1996 | Kuo et al. |
| 5,844,825 A | 12/1998 | Wang et al. |
| 6,205,461 B1* | 3/2001 | Mansingh ............... G06F 7/485 708/211 |
| 6,687,262 B1* | 2/2004 | Jin ...................... G06F 9/30025 370/300 |
| 6,965,906 B1* | 11/2005 | Dhablania ............... H03M 7/24 708/204 |
| 2007/0258641 A1* | 11/2007 | Srinivasan ............. H03M 7/24 382/166 |
| 2009/0249032 A1 | 10/2009 | Nishihara et al. |
| 2011/0173421 A1* | 7/2011 | Chen ..................... G06F 9/3885 712/222 |

(Continued)

FOREIGN PATENT DOCUMENTS

| GB | 2 396 929 | 7/2004 |
| WO | 99/56202 | 11/1999 |

OTHER PUBLICATIONS

UK Combined Search and Examination Report dated Oct. 14, 2016 in GB 1608400.6, 10 pages.

*Primary Examiner* — Andrew Caldwell
*Assistant Examiner* — Emily E Larocque
(74) *Attorney, Agent, or Firm* — Nixon & Vanderhye P.C.

(57) ABSTRACT

A data processing system includes instruction decoder circuitry responsive to a conversion instruction FCVTJS to convert a double precision floating point number into a 32-bit integer number. Right shifting circuitry performs a right shift upon at least part of the input number and left shifting circuitry performs a left shift of at least part of the input number. Selection circuitry serves to select one of the right shifted number and the left shifted number as a selected shifted number which forms at least part of the output number which is generated.

13 Claims, 3 Drawing Sheets

(56) References Cited

U.S. PATENT DOCUMENTS

| | | | |
|---|---|---|---|
| 2013/0007075 A1* | 1/2013 | Oliver | G06F 7/483 708/203 |
| 2013/0151576 A1* | 6/2013 | Lutz | G06F 7/49957 708/209 |
| 2013/0304785 A1* | 11/2013 | Lutz | H03M 7/28 708/497 |
| 2016/0211862 A1* | 7/2016 | Ho | H03M 7/06 |

* cited by examiner

APPARATUS AND METHOD FOR SUPPORTING A CONVERSION INSTRUCTION

BACKGROUND

Field

This disclosure relates to data processing systems. More particularly, this disclosure relates to data processing systems that support conversion instructions that convert an input number to an output number with a different format from the input number.

Description

It is known to provide data processing systems which support conversion instructions that serve to convert an input number, such as a floating point number, to an output number, such as an integer number.

In order to improve processor efficiency it is desirable that the implementation of the support for instructions should be efficient, such as, for example, by not requiring too large a number of pipeline stages to perform and/or permitting use of a high clock speed.

SUMMARY

At least some embodiments of the present disclosure provide apparatus for processing data comprising:

processing circuitry to perform one or more processing operations specified by program instruction; and an instruction decoder to decode said program instructions to generate one or more control signals to control said processing circuitry to perform processing operations specified by said program instruction; wherein said program instruction include a conversion instruction to convert an input number to an output number;

said processing circuitry comprises:

right shifting circuitry to perform a right shift upon at least part of said input number to generate a right shifted number in response to said instruction decoder decoding said conversion instruction;

left shifting circuitry to perform a left shift upon at least part of said input number to generate a left shifted number in response to said instruction decoder decoding said conversion instruction; and selection circuitry to select one of said right shifted number and said left shifted number as a selected shifted number to form at least part of said output number.

At least some embodiments of the present disclosure provide apparatus for processing data comprising:

processing means for performing one or more processing operations specified by program instruction; and instruction decoding means for decoding said program instructions to generate one or more control signals to control said processing means to perform processing operations specified by said program instruction; wherein said program instruction include a conversion instruction to convert an input number to an output number;

said processing means comprises:

right shifting means for performing a right shift upon at least part of said input number to generate a right shifted number in response to said instruction decoding means decoding said conversion instruction:

left shifting circuitry to perform a left shift upon at least part of said input number to generate a left shifted number in response to said instruction decoding means decoding said conversion instruction; and selection circuitry to select one of said right shifted number and said left shifted number as a selected shifted number to form at least part of said output number.

At least some embodiments of the present disclosure provide a method of processing data comprising:

performing one or more processing operations specified by program instruction; and decoding said program instructions to generate one or more control signals to control performance of processing operations specified by said program instruction; wherein said program instruction include a conversion instruction to convert an input number to an output number:

method comprises:

performing a right shift upon at least part of said input number to generate a right shifted number in response to decoding of said conversion instruction;

performing a left shift upon at least part of said input number to generate a left shifted number in response to decoding of said conversion instruction; and selecting one of said right shifted number and said left shifted number as a selected shifted number to form at least part of said output number.

The above, and other objects, features and advantages of this disclosure will be apparent from the following detailed description of illustrative embodiments which is to be read in connection with the accompanying drawings.

EMBODIMENTS

Floating-point (FP) is a useful way of approximating real numbers using a small number of bits. The IEEE 754-2008 FP standard proposes multiple different formats for FP numbers, but the ones discussed in more detail below in respect of the example conversion instruction are binary 64 (also known as double precision, or DP), binary 32 (also known as single precision, or SP), and binary 16 (also known as half precision, or HP). The numbers 64, 32, and 16 refer to the number of bits required for each format.

Representation

FP numbers are quite similar to the "scientific notation" taught in science classes, where negative two million is expressed as $-2.0 \times 10^6$. The parts of this number are the sign (in this case negative), the significand (2.0), the base of the exponent (10), and the exponent (6). All of these parts have analogs in FP numbers, although there are differences, the most important of which is that the constituent parts are stored as binary numbers, and the base of the exponent is 2.

More precisely, FP numbers consist of a sign bit, some number of biased exponent bits, and some number of fraction bits. In particular, the principle formats of interest consist of the following bits:

TABLE 1

| format | sign | exponent | fraction | exponent bias |
|---|---|---|---|---|
| DP [63:0] | 63 | 62:52 (11 bits) | 51:0 (52 bits) | 1023 |
| SP [31:0] | 31 | 30:23 (8 bits) | 22:0 (23 bits) | 127 |
| HP [15:0] | 15 | 14:10 (5 bits) | 9:0 (10 bits) | 15 |

The sign is 1 for negative numbers and 0 for positive numbers. Every number, including zero, has a sign.

The exponent is biased, which means that the true exponent differs from the one stored in the number. For example, biased SP exponents are 8-bits long and range from 0 to 255. Exponents 0 and 255 are special cases, but all other exponents have bias 127, meaning that the true exponent is 127 less than the biased exponent. The smallest biased exponent is 1, which corresponds to a true exponent of −126. The maximum biased exponent is 254, which corresponds to a true exponent of 127. HP and DP exponents work the same way, with the biases indicated in the Table 1 above.

SP exponent 255 (or DP exponent 2047, or HP exponent 31) is reserved for infinities and special symbols called NaNs (not a number). Infinities (which can be positive or negative) have a zero fraction. Any number with exponent 255 and a nonzero fraction is a NaN. Infinity provides a saturation value, so it actually means something like "this computation resulted in a number that is bigger than what we can represent in this format." NaNs are returned for operations that are not mathematically defined on the real numbers, for example division by zero or taking the square root of a negative number.

Exponent zero, in any of the formats, is reserved for subnormal numbers and zeros. A normal number represents the value:

$$-1^{sign} \times 1.\text{fraction} \times 2^e$$

where e is the true exponent computed from the biased exponent. The term 1.fraction is called the significand, and the 1 is not stored as part of the FP number, but is instead inferred from the exponent. All exponents except zero and the maximum exponent indicate a significand of the form 1.fraction. The exponent zero indicates a significand of the form 0.fraction, and a true exponent that is equal to 1−bias for the given format. Such a number is called subnormal (historically these numbers were referred to as denormal, but modern usage prefers the term subnormal).

Numbers with both exponent and fraction equal to zero are zeros.

Table 2 has some example numbers in a HP format. The entries are in binary, with '_' characters added to increase readability. Notice that the subnormal entry (4th line of the table, with zero exponent) produces a different significand than the normal entry in the preceding line.

TABLE 2

| sign | 5-bit exponent | 10-bit fraction | 11-bit significand | value |
|---|---|---|---|---|
| 0 | 01111 | 00_0000_0000 | 100_0000_0000 | $1.0 \times 2^0$ |
| 1 | 01110 | 10_0000_0000 | 110_0000_0000 | $-1.1 \times 2^{-1}$ |
| 0 | 00001 | 10_0000_0000 | 110_0000_0000 | $1.1 \times 2^{-14}$ |
| 0 | 00000 | 10_0000_0000 | 010_0000_0000 | $0.1 \times 2^{-14}$ |
| 1 | 11111 | 00_0000_0000 | | −infinity |
| 0 | 11111 | 00_1111_0011 | | NaN |

A large part of the complexity of FP implementation is due to subnormals, therefore they are often handled by microcode or software. It is also possible handle subnormals in hardware, speeding up these operations by a factor of 10 to 100 compared to a software or microcode implementation.

Integers, Fixed-Point, Floating-Point

The FP way of handling signs is called sign-magnitude, and it is different from the usual way integers are stored in the computer (two's complement). In sign-magnitude representation, the positive and negative versions of the same number differ only in the sign bit. A 4-bit sign-magnitude integer, consisting of a sign bit and 3 significand bits, would represent plus and minus one as:

+1=0001
−1=1001

In two's complement representation, an n-bit integer i is represented by the low order n bits of the binary n+1-bit value $2^n+i$, so a 4-bit two's complement integer would represent plus and minus one as:

+1=0001
−1=1111

The two's complement format is practically universal for signed integers because it simplifies computer arithmetic.

A fixed-point number looks exactly like an integer, but actually represents a value that has a certain number of fractional bits. Sensor data is often in fixed-point format, and there is a great deal of fixed-point software that was written before the widespread adoption of FP. Fixed-point numbers are quite tedious to work with because a programmer has to keep track of the "binary point", i.e. the separator between the integer and fractional parts of the number, and also has to constantly shift the number to keep the bits in the correct place. FP numbers don't have this difficulty, so it is desirable to be able to convert between fixed-point numbers and FP numbers. Being able to do conversions also means that fixed-point software and data can still be used, but new software is not limited to fixed-point.

Rounding FP Numbers

Most FP operations are required by the IEEE-754 standard to be computed as if the operation were done with unbounded range and precision, and then rounded to fit into an FP number. If the computation exactly matches an FP number, then that value is always returned, but usually the computation results in a value that lies between two consecutive floating-point numbers. Rounding is the process of picking which of the two consecutive numbers should be returned.

There are a number of ways of rounding, called rounding modes; six of these are explained below. These six are:

TABLE 3

| mode | | definition |
|---|---|---|
| RNE | round-to nearest, ties to even | pick the closest value, or if both values are equally close then pick the even value |
| RNA | round to nearest, ties to away | pick the closest value, or if both values are equally close then pick the value farthest away from zero |
| RZ | round to zero | pick the value closest to zero |
| RP | round to plus infinity | pick the value closest to plus infinity |
| RM | round to minus infinity | pick the value closest to minus infinity |
| RX | round to odd | pick the odd value |

The definition doesn't tell us how to round in any practical way. One common implementation is to do the operation, look at the truncated value (i.e. the value that fits into the FP format) as well as all of the remaining bits, and then adjust the truncated value if certain conditions hold. These computations are all based on:
L—(least) the least significant bit of the truncated value
G—(guard) the next most significant bit (i.e. the first bit not included in the truncation)
S—(sticky) the logical OR of all remaining bits that are not part of the truncation Given these three values and the truncated value, the correctly rounded value may be computed according to Table 4:

TABLE 4

| mode | change to the truncated value |
|------|-------------------------------|
| RNE  | increment if (L&G)|(G&S)     |
| RNA  | increment if G                |
| RZ   | none                          |
| RP   | increment if positive & (G|S) |
| RM   | increment if negative & (G|S) |
| RX   | set L if G|S                  |

For example, consider multiplying two 4-bit significands, and then rounding to a 4-bit significand.

sig1=1011 (decimal 11)

sig2=0111 (decimal 7)

multiplying yields sig1×sig2=1001_101 (decimal 77)

L Gss

The least significant bit of the truncated 4-bit result is labeled L, the next bit G, and S is the logical OR of the remaining bits labeled s (i.e. S=0|1=1). To round, the 4-bit result (1001) is adjusted according to the rounding mode and the computation in the table above. So for instance in RNA rounding, G is set so 1001+1=1010 is returned. For RX rounding G|S is true so L is set to 1 (it's already 1, so in this case nothing changes) and return 1001.

Rounding Integer and Fixed-Point Numbers

If an FP number is converted to integer or fixed-point rounding may also be needed. The concept is largely the same as FP rounding. An FP number that happens to be an integer rounds to that integer. Other FP numbers lie between two consecutive integers, and rounding dictates which integer is returned. Unfortunately the rounding logic for integers is somewhat harder because of the differences between two's complement and sign-magnitude form. Incrementing a sign-magnitude number increases the magnitude, so the incremented number is farther away from zero. The same thing happens for positive two's complement numbers, but negative two's complement numbers become closer to zero when incremented. This means that the rounding logic has to change based on whether the integer is positive or negative. It also means care is needed in picking the base value (the value which will be incremented or not). For positive integers, that value is just the truncated FP significand, so 1.37 will have a base value of 1, and a result of either 1 or 2. For negative integers, the significand is truncated and the one's complement of the result is taken (one's complement is the original number with all bits inverted), −1.37 is truncated to 1 and then inverted, giving a base value of −2. Everything then works out since the wanted result is either −2 or (when incremented) −1.

To further complicate things, the method of conversion requires some computation to find L, G, and S for negative integers. Correct rounding would require completion of the two's complement process (invert and add 1) and then computation of L, G, and S, but adding that 1 is slow compared to just inverting. It would be better to compute the actual L, G, and S from the original shifted input (i.e., from the input before any handling of signs. So the floating-point 1.37 or −1.37 would both be right shifted to the integer 1).

Let L0, G0, and S0 be the least significant bit (lsb), guard and sticky before inverting, and let Li, Gi, and Si be lsb, guard and sticky after inverting, and finally let L, G, and S be the lsb, guard and sticky after inverting and adding 1.

If S0 is zero, then the bits contributing to Si are all ones, and hence S (obtained by adding 1 to those Si bits) is also zero. If S0 is nonzero, then Si is not all ones, and hence S is nonzero. So in all cases S0=S.

If G0 is zero, then Gi is 1, and G is also one except for the case when there is a carry-in from the S bits, which only happens when S0 is zero. If G0 is 1, then Gi is zero, and again G is also one except for the case where there is a carry-in from the S bits, which only happens when S0 is zero. So G=G0^S0.

By very similar logic, L=L0^(G0|S0).

Now that L, G, and S have been found for both negative and positive integers, the rounding rules as follows may be used:

TABLE 5

| mode | change to a positive value | change to a negative value |
|------|----------------------------|----------------------------|
| RNE  | increment if (L&G)|(G&S)   | increment if (L&G)|(G&S)   |
| RNA  | increment if G             | increment if (G&S)         |
| RZ   | none                       | increment if (G|S)         |
| RP   | increment if (G|S)         | increment if (G|S)         |
| RM   | none                       | none                       |
| RX   | set L if G|S               | set L if G|S               |

Fixed-point numbers round the same way as integers. The rules for unsigned conversions (to integer or fixed-point) are the same as the rules for positive conversions.

Injection Rounding

A faster way to do rounding is to inject a rounding constant as part of the significand addition that is part of almost every FP operation. To see how this works, consider adding numbers in dollars and cents and then rounding to dollars. Consider the addition:

$1.27
+ $2.35
$3.62

The sum $3.62 is closer to $4 than to $3, so either of the round-to-nearest modes should return $4. If the numbers are represented in binary, the same result could be achieved using the L, G, S method from the last section. But suppose fifty cents is added and then the result truncated 1.27
+ 2.35
+ 0.50   (rounding injection)
4.12

If just the dollar amount ($4) is returned from the sum ($4.12), then correct rounding is achieved using RNA rounding mode. If $0.99 is added instead of $0.50, then correct rounding is achieved using RP rounding. RNE is slightly more complicated: $0.50 is added, truncation performed, and then the remaining cents examined. If the cents remaining are nonzero, then the truncated result is correct. If there are zero cents remaining, then the number was exactly in between two dollar amounts before the injection, so the even dollar amount is picked. For binary FP this amounts to setting the least significant bit of the dollar amount to zero.

Adding three numbers is only slightly slower than adding two numbers, so the rounded result is obtained more quickly by using injection rounding than if two significands were added, L, G, and S examined, and then the our result incremented according to the rounding mode.

Implementing Injection Rounding

For FP, the rounding injection is one of three different values, values which depend on the rounding mode and (sometimes) the sign of the result.

Both RNA and RNE require injection a 1 at the G position (this is like adding $0.50 in the dollars and cents example).

RP and RM rounding depends on the sign as well as the mode. RP rounds positive results up (increases the magnitude of the significand towards positive infinity), but truncates negative results (picking the significand that is closer to positive infinity). Similarly RM rounds negative results up (increasing the magnitude of the significand toward negative infinity), but truncates positive results (picking the significand that is closer to negative infinity). Thus RM and RP may be split into two cases: round up (RU) when the sign matches the rounding direction, and truncation (RZ) when the sign differs from the rounding injection. For RU cases a 1 is injected at the G-bit location and at every location that contributes logically to S (this is like adding $0.99 in our dollars and cents example).

For RZ and RX modes, and for RP and RM modes that reduce to RZ mode, zeros are injected.

For most of the rounding modes, adding the rounding injection and then truncating gives the correctly rounded result. The two exceptions are RNE and RX, which require G and S to be examined after the addition. For RNE, L is set to 0 if G and S are both zero. For RX L is set to 1 if G or S are nonzero.

FP Number are not Real Numbers

It's tempting to think of FP numbers as being just like real numbers, but they are fundamentally different, even for the most basic properties:

1. They are not associative. For example, in SP we can add 3 numbers and return 1 million or zero, perhaps not what people think of as a rounding error:

$(2^{45}+-2^{45})+2^{20}=2^{20}$ $2^{45}+(-2^{45}+2^{20})=0$

2. They don't obey the distributive laws. Again in SP:

$3{,}000{,}001*(4.00001+5.00001)=0x4bcdfe83$ $(3{,}000{,}001*4.00001)+(3{,}000{,}001*5.00001)$
$=0x4bcdfe82$ and things get even worse in the presence of overflow:

$20^{50}*(2^{78}-2^{27})=2^{127}$ $(2^{50}*2^{78})-(2^{50}*2^{77})=\text{infinity}$ 3. For at least some ARM processors, they aren't even commutative unless operating in default NaN mode (a mode that converts all NaNs to a single NaN), because in general nanA+nanB!=nanB+nanA. Numeric adds and multiplies are commutative.

4. Because of IEEE NaN rules, there are no multiplicative or additive identities. One and zero work as identities for numeric values.

One useful way to think of FP numbers is to consider them to be very long fixed-point numbers in which at most a few (53 for DP) consecutive bits can be nonzero. For example, non-infinite DP numbers can have the first bit of the significand in any of 2046 places, and that first bit is followed by 52 other significand bits, and there is a sign bit, so any finite DP number can be represented as a 2046+52+1=2099-bit fixed point number. Examined this way it is clear that adding two FP numbers does not, in general, result in another FP number: the result of the addition has to be rounded so that it becomes an FP number.

Figure 1:
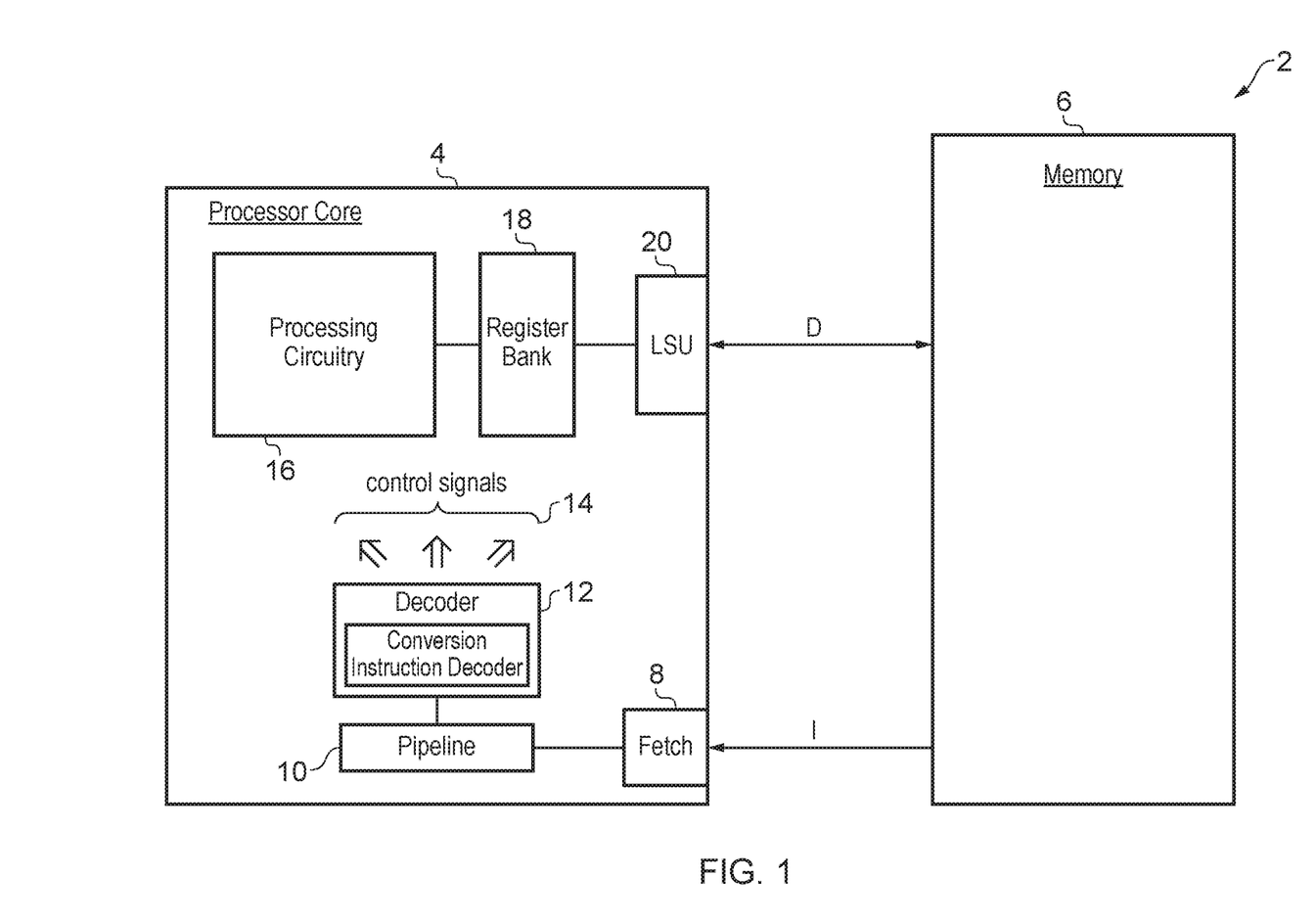
FIG. 1 schematically illustrates a data processing apparatus that includes support for conversion instructions.

FIG. 1 schematically illustrates a data processing apparatus 2 including a processor core 4 coupled to a memory 6. The memory 6 stores program instructions to be executed and data values to be manipulated. Program instructions are fetched by a fetch unit 8 into an instruction pipeline 10. At a decode stage of the instruction pipeline 10 an instruction decoder 12 serves to decode the program instructions to generate control signals 14 which are supplied to processing circuitry 16 to perform processing operations specified by the program instructions. Data values to be manipulated are stored within a register bank 18. This register bank 18 may include both integer registers and floating point registers. Separate register banks for integer and floating point values may also be used. A load/store unit 20 is responsible for performing load instructions fetching data values from the memory 6 into the register bank 18 and store instructions for storing data values from the register bank 18 into the memory 6.

The instruction decoder 12 includes circuitry for decoding a conversion instruction FCVTJS which serves to convert an input number, such as a double-precision floating point number, into an output number, such as a 32-bit integer value. Such a program instruction may be helpful in implementing a JavaScript double-to-int32 operation as a native instruction. This FCVTJS instruction may produce an output word of 32-zero bits for any double precision floating point input operands that are NaNs (not a number), zeros, or infinities. Other input values are rounded toward zero, and the bottom 32-bits are returned. Thus, if an input number is outside of the range $-2^{31}$ to $2^{31}-1$, then the FCVTJS conversion instruction returns a result which is a modulo $2^{32}$ value.

It will be appreciated that the above example of the FCVTJS instruction which is a conversion instruction is only one possible example of such a conversion instruction. For example, the input number may be other than a double-precision floating point number and the output number may be other than a 32-bit signed integer.

Figure 2:
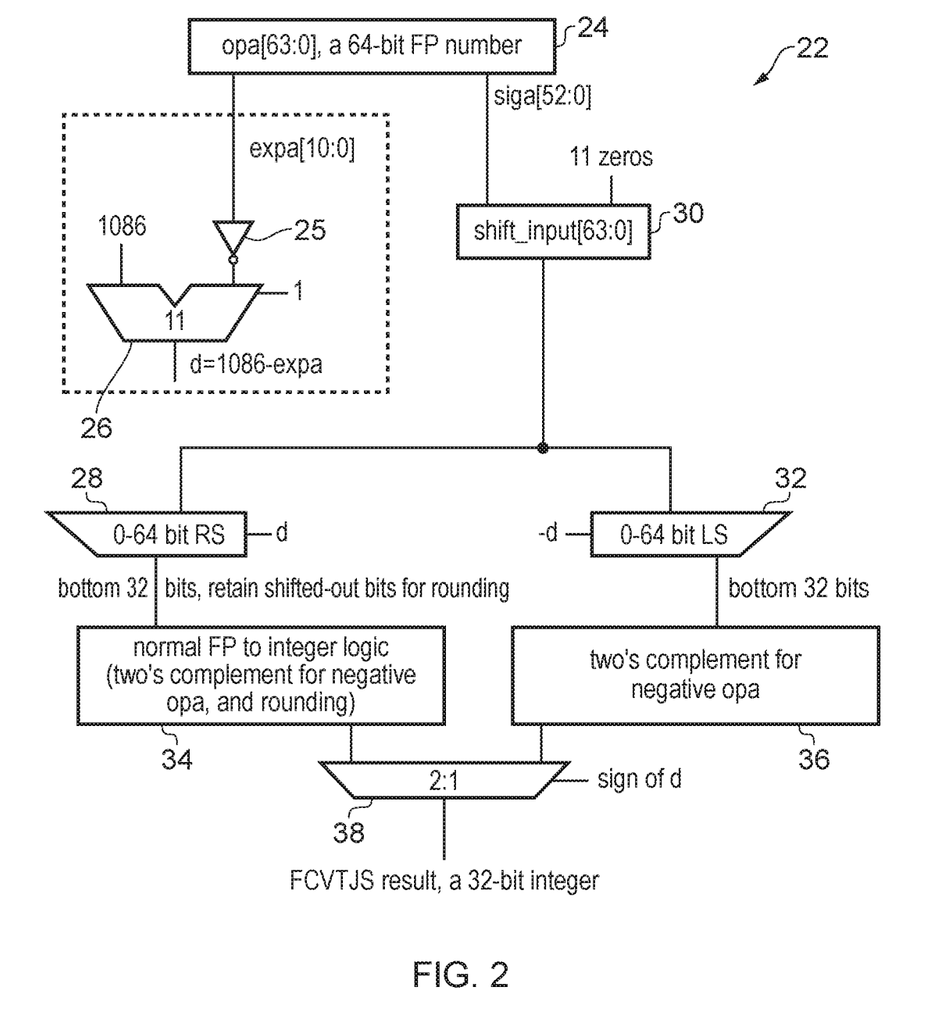
FIG. 2 schematically illustrates a processing pipeline for performing a conversion instruction.

FIG. 2 schematically illustrates a processing pipeline 22 which may form part of the processing circuitry 16 and serves to implement the FCVTJS conversion instruction described above. An input number in the form, for example, of a double-precision (64-bit) floating point number is received as an input number (operand) at an input register 24 and forms an input operand opa[63:0]. The 11-bit biased exponent value expa[10:0] of the input number is supplied via a bitwise inverter 25 to an 11-bit adder 26 which serves to determine a shift amount d in dependence upon a difference between the bit size of the intermediate target integer number (that is in this example a 64-bit integer) and the exponent value when compensated for its bias. If the output number is an N-bit integer number and the floating-point number has an exponent value E and a significand value S, then the shift amount d is given by (N−1)−E, where E is the true (unbiased) exponent such that E=expa−bias. When a bias of 1023 for a double precision floating point number is taken into account, this corresponds to the shift amount being given by 1086-expa as shown in FIG. 2. The shift amount d is the right shift amount which is applied by right shifting circuitry 28 to the 53-bit significand S shown as siga [52:0] that has been subject to padding at its least significant end by eleven zeros to form a shift input at stage 30. i.e. a 64-bit value shift input [63:0]. This shift input value is also supplied to left shifting circuitry 32 where it is subject to a left shift by a left shift amount given by −d. This left shift amount corresponds to E−(N−1) in terms of the exponent value of the input floating point number (compensated for its bias) and the bit size of the desired N-bit output integer value.

The action of the right shifting circuitry 28 is to shift any bits within the significand siga [52:0] having a same bit significance as a bit position within the output 32-bit integer value to a bit position within the right shifted number generated by the right shifting circuitry 28 which matches the bit position within the output 32-bit integer number. The right shifting circuitry 28 also serves to set to zero any bit positions within the right shifted number output therefrom that do not have bits shifted to them from the significant value by the right shift amount which is applied.

The left shifting circuitry 32 serves to shift any bits within the significand siga [52:0] having the same bit significance as a bit position within the output 32-bit integer value to a bit position within the left shifted number which matches the bit position within the output 32-bit output integer value. The left shifting circuitry 32 also sets to zero, any bit positions within the left shifted number without bits shifted to them from the significant value siga [52:0] by the left shift amount which is applied.

The output from the right shifting circuitry 28 is the bottom 32 bits of the right shifted value it contains. Shifted out bits are retained for rounding in accordance with the rounding mode currently selected. The action of the right shifting circuitry 28 in outputting only the bottom 32-bits is such that the right shifting circuitry 28 also serves as truncation circuitry which serves to form the output number (or at least a number from which the output number will be derived) from a least significant portion of the right shifted number.

A two's complement and rounding circuit 34 serves to perform a two's complement operation upon the truncated right shifted number if the sign of the input floating point number is negative. This two's complement circuitry 34 also serves to perform any rounding required in accordance with the retained shifted-out bits and the selected rounding mode.

The left shifting circuitry 32 also serves as truncation circuitry by virtue of outputting the bottom 32 bits of the left shifted value to serve in generating the output number. A further two's complement circuit 36 serves to perform a two's complement operation upon the bottom 32-bits if the sign of the input floating point number is negative.

Selection circuitry 38 serves to select the truncated (and possibly two's complemented) lower 32 bits from either the truncated right shifted value or the truncated left shifted value in dependence upon the shift amount d calculated by the adder 26.

The selection circuitry 38 serves to select the right shifted number, or at least the number derived from the right shifting path, as the selected shifted number when the floating point number is equal to or less than a maximum number representable as the integer number to be output. The selection circuitry 38 selects the left shifted number, or at least a number derived therefrom, as the selected shift number when the floating point number is greater than a maximum number representable as the output integer number.

The input value in the circuitry of FIG. 2 is a DP FP number, consisting of a sign, an 11-bit biased exponent, and a 52-bit fraction. For nonzero biased exponents, the 53-bit significand is constructed by preprending a 1 to the 52-bit fraction. The significand is then padded with 11 rightmost zeros to create a 64-bit shift input.

Consider the following examples:

(1) Right shift example: $3=(binary)1.1*2^1$, has biased exponent $1023+1=1024$, and hence $d=1086-1024=62$. The shift input will be the two binary ones (binary significand 1.1) followed by 62 zeros. When the circuitry right shifts this by 62 bit positions, the result is 62 zeros followed by two one bits, which is the 32-bit binary integer representation of 3. In this case nothing is shifted out, so the result is exact and does not require rounding.

(2) Right shift example with rounding: $3.75=binary$ $1.111*2^1$. Everything proceeds as in example (1), but two 1 bits are shifted out (representing 0.75 decimal), so the rounding mode will be used to choose between 3 and 4.

(3) Left shift example: $2^{80}+2^{28}$ has biased exponent $1023+80=1103$, and hence $d=1086-1103=-17$. The shift input is binary 1 (representing $2^{80}$) followed by 51 zeros followed by another binary 1 (representing $2^{28}$), followed by 11 zeros. The circuitry left shifts this by 17 (discarding anything above bit 32) to get the 32-bit integer representation of $2^{28}$. There is no rounding on this path because the minimum left shift input has true exponent 64, and so every bit of the fraction represents integer bits.

TABLE 6

| true exp | d = 63 − true_exp | right shift | left shift | remarks |
|---|---|---|---|---|
| −1 | 64 | 64 | | this exp and smaller, bits shifted out completely, shift input used only for rounding |
| 0 | 63 | 63 | | beginning of right shift cases with some integer bits |
| 1 | 62 | 62 | | |
| 2 | 61 | 61 | | |
| 3 | 60 | 60 | | |
| 4 | 59 | 59 | | |
| 5 | 58 | 58 | | |
| 6 | 57 | 57 | | |
| 7 | 56 | 56 | | |
| 8 | 55 | 55 | | |
| 9 | 54 | 54 | | |
| 10 | 53 | 53 | | |
| 11 | 52 | 52 | | |
| 12 | 51 | 51 | | |

TABLE 6-continued

| true exp | d = 63 − true_exp | right shift | left shift | remarks |
|---|---|---|---|---|
| 13 | 50 | 50 | | |
| 14 | 49 | 49 | | |
| 15 | 48 | 48 | | |
| 16 | 47 | 47 | | |
| 17 | 46 | 46 | | |
| 18 | 45 | 45 | | |
| 19 | 44 | 44 | | |
| 20 | 43 | 43 | | |
| 21 | 42 | 42 | | |
| 22 | 41 | 41 | | |
| 23 | 40 | 40 | | |
| 24 | 39 | 39 | | |
| 25 | 38 | 38 | | |
| 26 | 37 | 37 | | |
| 27 | 36 | 36 | | |
| 28 | 35 | 35 | | |
| 29 | 34 | 34 | | |
| 30 | 33 | 33 | | |
| 31 | 32 | 32 | | |
| 32 | 31 | 31 | | |
| 33 | 30 | 30 | | |
| 34 | 29 | 29 | | |
| 35 | 28 | 28 | | |
| 36 | 27 | 27 | | |
| 37 | 26 | 26 | | |
| 38 | 25 | 25 | | |
| 39 | 24 | 24 | | |
| 40 | 23 | 23 | | |
| 41 | 22 | 22 | | |
| 42 | 21 | 21 | | |
| 43 | 20 | 20 | | |
| 44 | 19 | 19 | | |
| 45 | 18 | 18 | | |
| 46 | 17 | 17 | | |
| 47 | 16 | 16 | | |
| 48 | 15 | 15 | | |
| 49 | 14 | 14 | | |
| 50 | 13 | 13 | | |
| 51 | 12 | 12 | | |
| 52 | 11 | 11 | | |
| 53 | 10 | 10 | | |
| 54 | 9 | 9 | | |
| 55 | 8 | 8 | | |
| 56 | 7 | 7 | | |
| 57 | 6 | 6 | | |
| 58 | 5 | 5 | | |
| 59 | 4 | 4 | | |
| 60 | 3 | 3 | | |
| 61 | 2 | 2 | | |
| 62 | 1 | 1 | | |
| 63 | 0 | 0 | | |
| 64 | −1 | | 1 | beginning of left shift cases |
| 65 | −2 | | 2 | |
| 66 | −3 | | 3 | |
| 67 | −4 | | 4 | |
| 68 | −5 | | 5 | |
| 69 | −6 | | 6 | |
| 70 | −7 | | 7 | |
| 71 | −8 | | 8 | |
| 72 | −9 | | 9 | |
| 73 | −10 | | 10 | |
| 74 | −11 | | 11 | |
| 75 | −12 | | 12 | |
| 76 | −13 | | 13 | |
| 77 | −14 | | 14 | |
| 78 | −15 | | 15 | |
| 79 | −16 | | 16 | |
| 80 | −17 | | 17 | |
| 81 | −18 | | 18 | |
| 82 | −19 | | 19 | |
| 83 | −20 | | 20 | |
| 84 | −21 | | 21 | last possible case with a nonzero integer result |

Table 6 shows possible left and right shift values for each exponent value in the case of the example of converting a double precision floating point number (DP FP) to a 32-bit integer number. True exponents less than zero map to an integer value of zero or one, depending upon the rounding mode. True exponents greater than 84 return zero. The range of true exponents which produce values other than those specified above is 0 to 84, as set out in Table 6.

Figure 3:
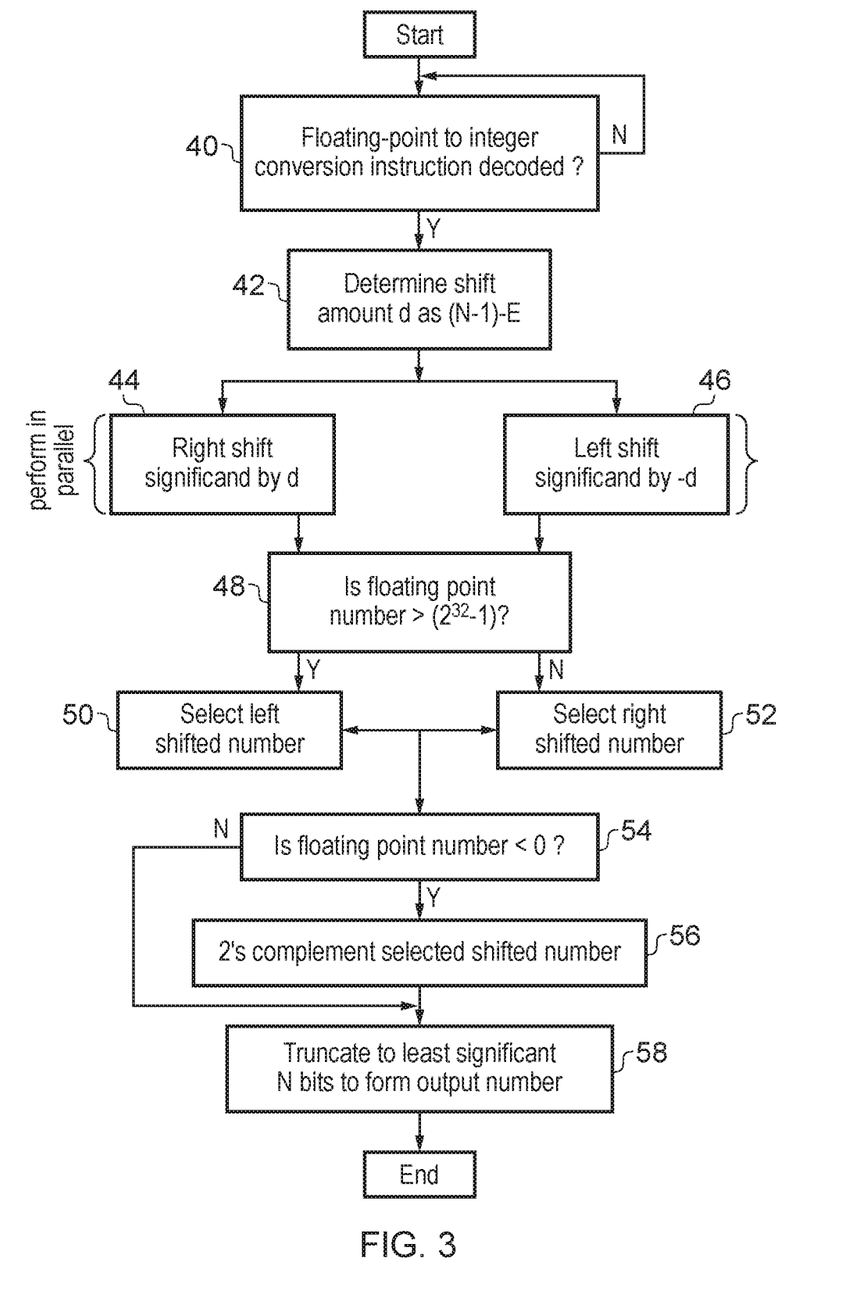
FIG. 3 is a flow diagram schematically illustrating the operation of the pipeline of FIG. 2.

FIG. 3 is a flow diagram schematically illustrating the operation of the circuitry of FIG. 2. At step 40 processing waits until a floating-point to integer conversion instruction FCVTJS is decoded by the instruction decoder 12. Step 42 determines a shift amount d as (N−1)−E where N is 64 and E is the true exponent. Steps 44 and 46 are performed in parallel respectively by the right shifting circuitry 28 and the left shifting circuitry 32 to perform a right shift of the padded significand by d and a left shift of the padded significant by −d. Step 48 determines whether the floating point number is greater than the maximum number which may be represented by the output integer number of the instruction, namely the floating point number is greater than $(2^{32}-1)$ where the output of the instruction is a 32-bit integer. If the floating point number is greater in size than the maximum number representable in the output integer, then the left shifted number is selected at step 50. If the floating point number is less than the maximum number representable by the output integer number, then the right shifted number is selected at step 52.

Step 54 then determines whether or not the floating point number is negative (i.e. less than zero). If the floating point number is negative, then step 56 performs a two's complement operation upon the selected shifted number which was selected at either step 50 or 52. If the floating point number is not negative, then step 56 is bypassed. Step 58 truncates the shifted number to the least significant 32 bits in order to form the output integer number, which in this example is a 32-bit integer. It will be appreciated that in the flow diagram of FIG. 3, the truncation step is shown at the end whereas in the circuitry of FIG. 2, the truncation is performed as part of the action of the right shifting circuitry 28 and the left shifting circuitry 32 (i.e. each output their bottom 32-bits of the shifted number which they have respectively generated). Either of these possibilities may be used depending upon the particular implementation.

Although illustrative embodiments have been described in detail herein with reference to the accompanying drawings, it is to be understood that the claims are not limited to those precise embodiments, and that various changes, additions and modifications can be effected therein by one skilled in the art without departing from the scope and spirit of the appended claims. For example, various combinations of the features of the dependent claims could be made with the features of the independent claims.

We claim:

1. Apparatus for processing data comprising:
    processing circuitry to perform one or more processing operations specified by program instruction; and
    an instruction decoder to decode said program instructions to generate one or more control signals to control said processing circuitry to perform processing operations specified by said program instruction; wherein
    said program instruction includes a conversion instruction to convert an input number to an output number;
    said processing circuitry comprises:
    right shifting circuitry to perform a right shift upon at least part of said input number to generate a right shifted number in response to said instruction decoder decoding said conversion instruction;

left shifting circuitry to perform a left shift upon at least part of said input number to generate a left shifted number in response to said instruction decoder decoding said conversion instruction; and selection circuitry to select one of said right shifted number and said left shifted number as a selected shifted number to form at least part of said output number;

wherein said input number is a floating-point number having an exponent value E and a significand value S, and said output number is an N-bit integer number having an integer value;

wherein said selection circuitry is configured to select said left shifted number as said selected shifted number when said floating point number is greater than a maximum number representable as said integer number; and wherein in response to said conversion instruction, said instruction decoder is configured to control both the right shifting circuitry to perform the right shift and the left shifting circuitry to perform the left shift.

2. Apparatus as claimed in claim 1, wherein said right shifting circuitry is responsive to said exponent value to right shift at least part of said significand value by a right shift amount dependent upon said exponent value; and said right shift amount shifts any bits within said significand having a same bit significance as a bit position within said integer value to a bit position within said right shifted number matching said bit position within said integer number.

3. Apparatus as claimed in claim 2, wherein said right shifting circuitry sets to zero any bit positions within said right shifted number without bits shifted thereto from said significand value by said right shift amount.

4. Apparatus as claimed in claim 2, wherein said right shift amount is (N−1)−E.

5. Apparatus as claimed in claim 1, wherein said left shifting circuitry is responsive to said exponent value to left shift at least part of said significand value by a left shift amount dependent upon said exponent value; and said left shift amount shifts any bits within said significand having a same bit significance as a bit position within said integer value to a bit position within said left shifted number matching said bit position within said integer number.

6. Apparatus as claimed in claim 5, wherein said left shifting circuitry sets to zero any bit positions within said left shifted number without bits shifted thereto from said significand value by said left shift amount.

7. Apparatus as claimed in claim 5, wherein said left shift amount is E−(N−1).

8. Apparatus as claimed in claim 1, wherein said selection circuitry selects said right shifted number as said selected shifted number when said floating point number is equal to or less than a maximum number representable as said integer number.

9. Apparatus as claimed in claim 1, wherein said processing circuitry comprises two's-complement circuitry to perform a two's complement operation upon said selected shifted number when said input number is negative.

10. Apparatus as claimed in claim 1, wherein said processing circuitry comprises truncation circuitry to form as said output number a least significant bit portion of said selected shifted number.

11. Apparatus as claimed in claim 1, said processing circuitry comprises truncation circuitry to form as said output number a least significant N bits of said selected shifted number.

12. Apparatus as claimed in claim 1, wherein in response to said conversion instruction, said instruction decoder is configured to control the right shifting circuitry to perform the right shift in parallel with the left shifting circuitry performing the left shift.

13. A method of processing data comprising:

performing one or more processing operations specified by program instruction; and decoding said program instruction to generate one or more control signals to control performance of processing operations specified by said program instruction;

wherein said program instruction includes a conversion instruction to convert an input number to an output number, which when decoded, generates one or more control signals to control performance of the processing operations including:

performing a right shift upon at least part of said input number to generate a right shifted number in response to decoding of said conversion instruction;

performing a left shift upon at least part of said input number to generate a left shifted number in response to decoding of said conversion instruction; and selecting one of said right shifted number and said left shifted number as a selected shifted number to form at least part of said output number;

wherein said input number is a floating-point number having an exponent value E and a significand value S, and said output number is an N-bit integer number having an integer value;

wherein said selecting includes selecting said left shifted number as said selected shifted number when said floating point number is greater than a maximum number representable as said integer number; and wherein both the right shift and the left shift are performed in response to the same conversion instruction.

* * * * *